(12) United States Patent
Sugizaki

(10) Patent No.: US 7,602,011 B2
(45) Date of Patent: Oct. 13, 2009

(54) SEMICONDUCTOR MEMORY DEVICE HAVING CHARGE STORAGE LAYER AND METHOD OF MANUFACTURING THE SAME

(75) Inventor: Taro Sugizaki, Fujisawa (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/802,815

(22) Filed: May 25, 2007

(65) Prior Publication Data

US 2007/0228454 A1   Oct. 4, 2007

Related U.S. Application Data

(63) Continuation of application No. PCT/JP2004/017776, filed on Nov. 30, 2004.

(51) Int. Cl.
*H01L 29/792* (2006.01)
*H01L 29/788* (2006.01)

(52) U.S. Cl. .................................. 257/324; 257/316

(58) Field of Classification Search ......... 257/314–317, 257/319–325, E21.423, E29.309
See application file for complete search history.

(56) References Cited

U.S. PATENT DOCUMENTS

| 6,060,743 | A | 5/2000 | Sugiyama et al. |
| 2003/0185071 | A1 | 10/2003 | Yoshino |
| 2003/0222294 | A1 | 12/2003 | Yoshino |
| 2005/0122775 | A1 | 6/2005 | Koyanagi et al. |

FOREIGN PATENT DOCUMENTS

| JP | 5-129629 A | 5/1993 |
| JP | 11-40809 A | 2/1999 |
| JP | 2000-340682 A | 12/2000 |
| JP | 2000-22005 A | 1/2001 |
| JP | 2003-133540 A | 5/2003 |
| JP | 2003-282748 A | 10/2003 |
| JP | 2003-347437 A | 12/2003 |
| JP | 2004-55969 A | 2/2004 |
| JP | 2004-111734 A | 4/2004 |
| WO | WO 2004/010508 A1 | 1/2004 |

OTHER PUBLICATIONS

International Search Report of PCT/JP2004/017776, mailing date Jan. 18, 2005.
Prior Art Information List.

*Primary Examiner*—Hung Vu
(74) *Attorney, Agent, or Firm*—Fujitsu Patent Center

(57) ABSTRACT

The semiconductor memory device according to the present invention includes a charge storage layer 26 formed over a semiconductor substrate 10 and including a plurality of particles 16 as charge storage bodies in insulating films 12, 24, and a gate electrode 30 formed over the charge storage layer 26, in which the particles 16 are formed of metal oxide or metal nitride.

8 Claims, 8 Drawing Sheets

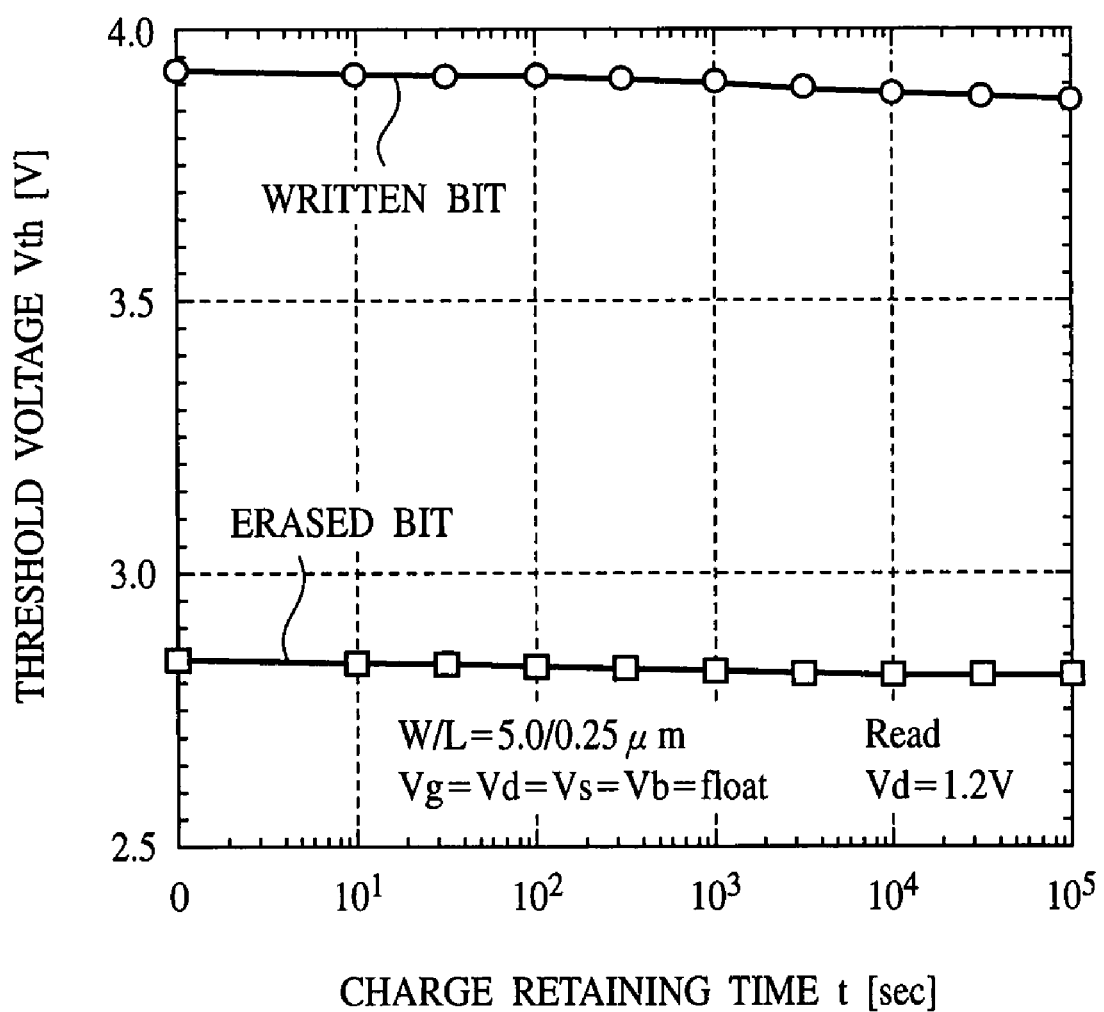

SEMICONDUCTOR MEMORY DEVICE HAVING CHARGE STORAGE LAYER AND METHOD OF MANUFACTURING THE SAME

CROSS REFERENCE TO RELATED APPLICATIONS

This application is a Continuation of International Application No. PCT/JP2004/017776, with an international filing date of Nov. 30, 2004, which designating the United States of America, the entire contents of which are incorporated herein by reference.

TECHNICAL FIELD

The present invention relates to a semiconductor memory device and a method of manufacturing the same, more specifically, a semiconductor memory device which stores charges in nanodots, nanoparticles or others to thereby memorize information.

BACKGROUND ART

Recently, the field of the nanotechnology is noted. This field is of technologies utilizing phenomena invisible or unrealizable in the macro-state by using nanometer-sized substances and particles. Among these technologies, memory devices which store charges in nanodots or nanoparticles to thereby memorize information are proposed.

As the typical memory device using nanodots and nanoparticles, the memory device using silicon nanocrystals is noted. The memory device using silicon nanocrystals comprises silicon particles formed in an insulating film over a silicon substrate store charges in the particles to make memory operations.

The memory devices using nanodots and nanoparticles are described in, e.g., Patent Reference 1 to 3.

Patent Reference 1: Japanese published unexamined patent application No. Hei 11-040809
Patent Reference 2: Japanese published unexamined patent application No. 2000-022005
Patent Reference 3: Japanese published unexamined patent application No. 2004-111734

DISCLOSURE OF INVENTION

Problems to be Solved by the Invention

However, the silicon nanocrystals have the minimum particle size of only about 6-10 nm and have the surface density limited to about $1 \times 10^{12}$ cm$^{-2}$. Such size and surface density make the dot number per 1 cell (1 bit) small unsuitably for the future miniaturization of the device. In the 45-nm generation device, for example, the dot number per 1 cell is 20 pieces when converted from the above-described surface density. In this case, if the dot number is varied by 2 pieces due to fluctuations of the process, the stored charge amount will be varied by as much as 10%, and the miniaturization will be soon limited.

An object of the present invention is to provide a semiconductor memory device, which stores charges in charge accumulators, such as nanodots, nanoparticles or others to memorize information and a method of manufacturing the same, including particles which are much miniaturized as charge storage bodies and formed in a high surface density, and a method of manufacturing the semiconductor memory device.

Means for Solving the Problems

According to one aspect of the present invention, there is provided a semiconductor memory device comprising a charge storage layer formed over a semiconductor substrate and including a plurality of particles as charge storage bodies in an insulating film, and a gate electrode formed over the charge storage layer, the particles being formed of metal oxide or metal nitride.

According to another aspect of the present invention, there is provided a method of manufacturing a semiconductor memory device comprising the steps of: forming a first insulating film over a semiconductor substrate; forming a metal compound film of a metal oxide or a metal nitride over the first insulating film; self-cohering the metal compound film by a thermal processing to form a plurality of particles of the metal oxide or the metal nitride; forming a second insulating film over the first insulating film with the particles formed on; and forming a gate electrode over the second insulating film.

According to further another aspect of the present invention, there is provided a method of manufacturing a semiconductor memory device comprising the steps of: forming a first insulating film over a semiconductor substrate; forming a metal compound film of metal oxide or metal nitride over the first insulating film; forming a second insulating film over the metal compound film; self-cohere the metal compound film by a thermal processing to form a plurality of particles of the metal oxide or the metal nitride; and forming a gate electrode over the second insulating film.

Effect of the Invention

According to the present invention, the self-cohesiveness of metal oxide is utilized to form particles of the metal oxide, whereby the particles can be formed, much miniaturized in a high surface density. Thus, the semiconductor memory device can include the charge storage layer containing the particles as the charge storage bodies in a high density, and the fluctuations of the charge retaining amount can be suppressed small in more miniaturized devices.

BRIEF DESCRIPTION OF DRAWINGS

FIG. 1 is a diagrammatic sectional view showing a structure of a semiconductor memory device according to a first embodiment of the present invention.

FIG. 2 is a graph showing the writing time dependency of the shift amount of the threshold voltage of the semiconductor memory device according to the first embodiment of the present invention.

FIG. 3 is a graph showing the Id-Vg characteristics of the semiconductor memory device according to the first embodiment of the present invention.

FIG. 4 is a graph showing the charge retaining characteristics of the semiconductor memory device including the charge storage layer containing hafnium oxide film.

[FIG. 5] FIG. 5 is a graph showing the charge retaining characteristics of the semiconductor memory device including the charge storage layer containing hafnium oxide dots.

FIG. 6 is sectional views showing the method of manufacturing the semiconductor memory device according to the first embodiment of the present invention (Part 1).

FIG. 7 is sectional views showing the method of manufacturing the semiconductor memory device according to the first embodiment of the present invention (Part 2).

FIG. 8 is a graph showing the relationship between the film thickness of the hafnium oxide film and the particle diameter of the hafnium oxide dots.

FIG. 9 is sectional views showing another method of manufacturing the semiconductor memory device according to the first embodiment of the present invention.

FIG. 10 is a diagrammatic sectional view showing a structure of a semiconductor memory device according to a second embodiment of the present invention.

FIG. 11 is a graph showing the Id-Vg characteristics of the semiconductor memory device according to the second embodiment of the present invention.

FIG. 12 is sectional views showing the method of manufacturing the semiconductor memory device according to the second embodiment of the present invention.

EXPLANATION OF REFERENCE NUMERALS

Figure 1:
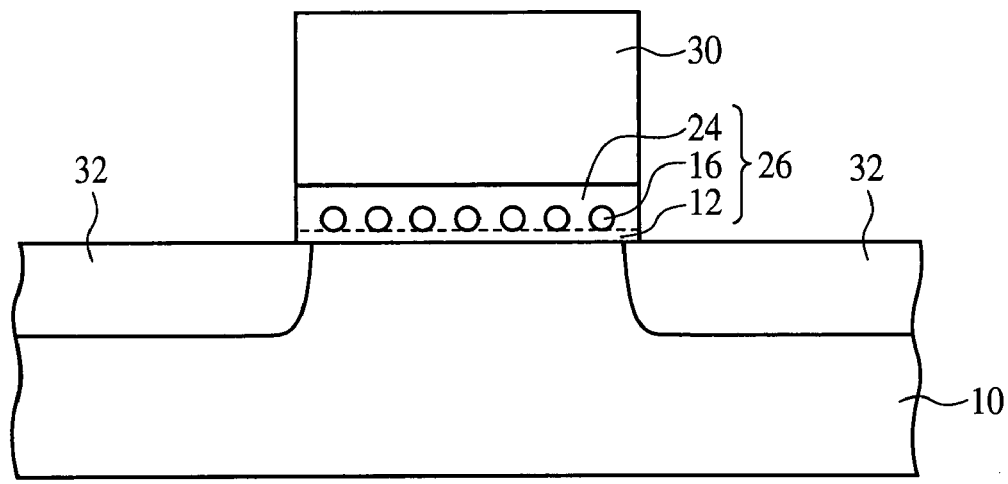
[FIG. 1]

10 . . . silicon substrate
12 . . . tunnel insulating film
14, 20 . . . hafnium oxide film
16, 22 . . . hafnium oxide dot
18 . . . intermediate insulating film
24 . . . top insulating film
26 . . . charge storage layer
28 . . . polycrystalline silicon film
30 . . . gate electrode
32 . . . source/drain region

BEST MODE FOR CARRYING OUT THE INVENTION

A First Embodiment

The semiconductor memory device and method of manufacturing the same according to a first embodiment of the present invention will be explained with reference to FIGS. 1 to 9.

Figure 2:
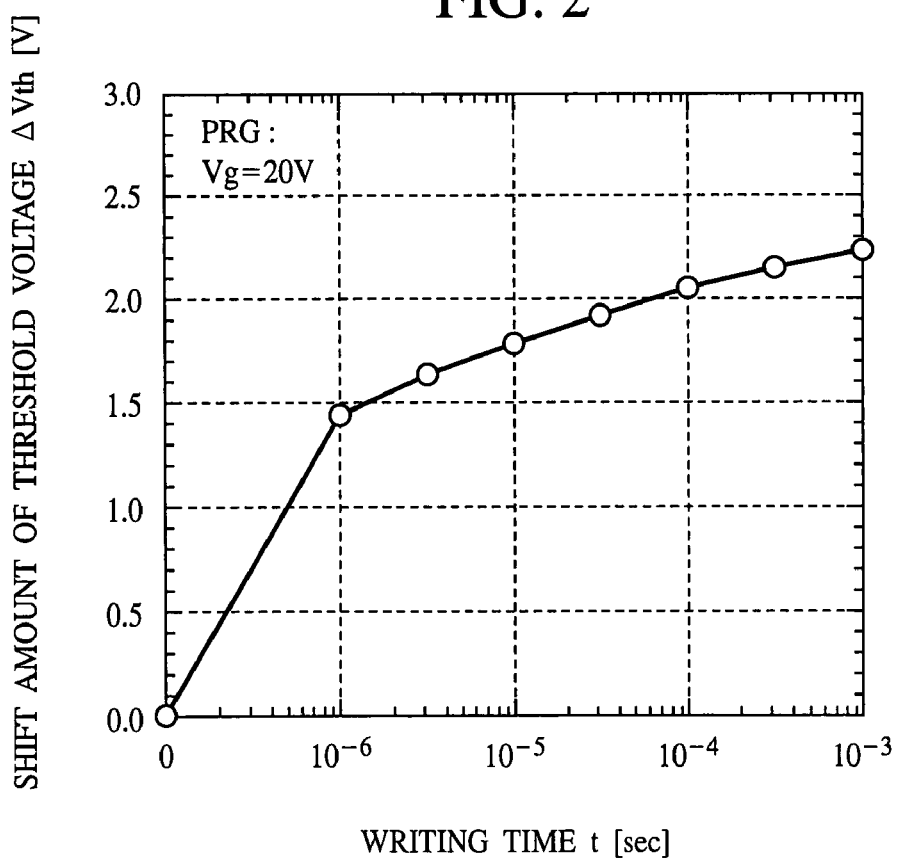
[FIG. 2]
Figure 3:
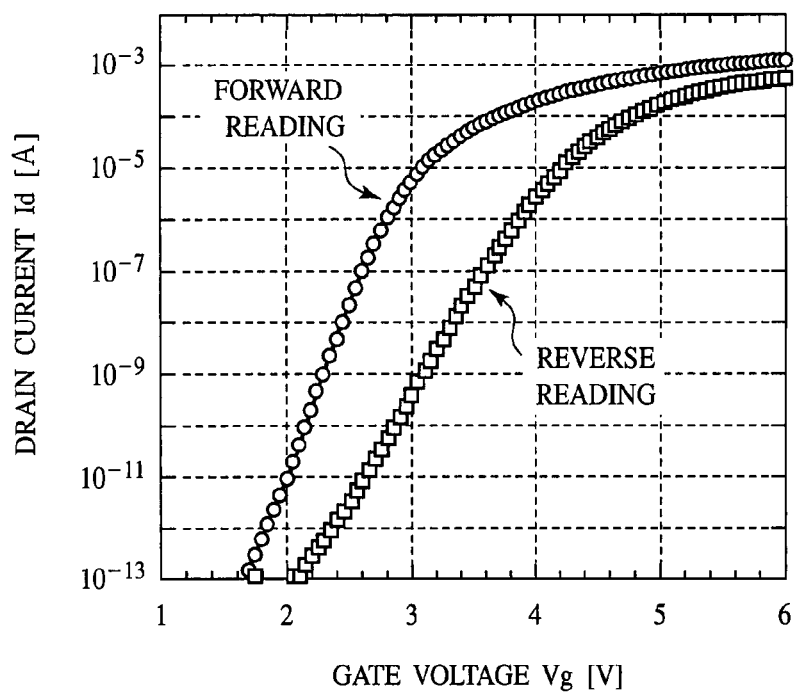
[FIG. 3]
Figure 4:
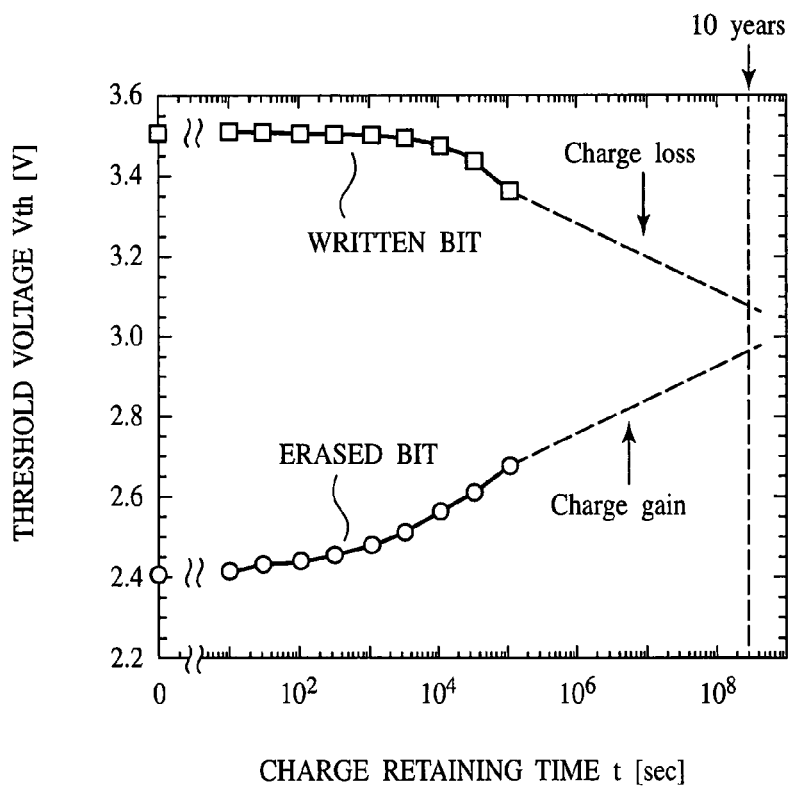
[FIG. 4]

FIG. 1 is a diagrammatic sectional view showing a structure of a semiconductor memory device according to the present embodiment. FIG. 2 is a graph showing the writing time dependency of the shift amount of the threshold voltage of the semiconductor memory device according to the present embodiment. FIG. 3 is a graph showing the Id-Vg characteristics of the semiconductor memory device according to the present embodiment. FIG. 4 is a graph showing the charge retaining characteristics of the semiconductor memory device including the charge storage layer containing hafnium oxide film. FIG. 5 is a graph showing the charge retaining characteristics of the semiconductor memory device including the charge storage layer containing hafnium oxide dots. FIGS. 6 and 7 are sectional views showing the method of manufacturing the semiconductor memory device according to the present embodiments. FIG. 8 is a graph showing the relationship between the film thickness of the hafnium oxide film and the particle diameter of the hafnium oxide dots. FIG. 9 is sectional views showing another method of manufacturing the semiconductor memory device according to the present embodiment.

First, the structure of the semiconductor memory device according to the present embodiment will be explained with reference to FIG. 1.

A charge storage layer 26 for storing charges as memory information is formed over a silicon substrate 10. The charge storage layer 26 includes a tunnel insulating film 12, a top insulating film 24 formed on the tunnel insulating film 12, and hafnium oxide dots formed separate from each other in the interface between the tunnel insulating film 12 and the top insulating film 24. A gate electrode 30 is formed over the charge storage layer 26. In the silicon substrate 10 on both sides of the gate electrode 30, source/drain regions 32 are formed.

As described above, the semiconductor memory device according to the present embodiment is characterized mainly in that the charge storage layer 26 has the hafnium oxide dots 16. Hafnium oxide is an insulating material but is a substance which functions as a trap of charges. Accordingly, the charge storage layer containing hafnium oxide dots is formed, whereby charges as memory information can be stored in the charge storage layer and can be used as a memory device.

The charges stored in the hafnium oxide dots 16 in the charge storage layer 26 never move in the film unless an electric field as high as the electric field required for writing is applied. Accordingly, the semiconductor memory device according to the present embodiment can form the NAND memory cell used as a 1 bit/1 transistor cell, in which a charge is written overall in the charge storage layer 26, and also can form the MirrorBit-type memory cell used as a 2 bits/1 transistor cell, in which a charges are written locally in the respective ends of the source/drain regions.

FIG. 2 is a graph showing the writing time dependency of the shift amount of the threshold voltage $\Delta$Vth of the semiconductor memory device according to the present embodiment. The writing in the sample used in this measurement was assumed to be in the NAND memory cells and was made by injecting electrons from the side of the substrate into the charge storage layer by F-N tunneling. At this time, the gate voltage Vg was set to Vg=20 V, and the substrate voltage Vb was set to Vb=0.

As seen in the graph, the shift amount of the threshold voltage $\Delta$Vth increases as the writing time is increased. Based on this, the charges are stored in the hafnium oxide dots 16 in the charge storage layer 26.

FIG. 3 is a graph showing the Id-Vg characteristics of the semiconductor memory device according to the present embodiment. The sample used in the measurement was assumed to be for the MirrorBit-type memory cell, and charges were injected locally in the charge storage layer near one of the source and the drain. The writing in the sample was made by injecting channel hot electrons with the gate voltage Vg being set to Vg=9 V, the drain voltage Vd being set to Vd=5 V and the writing time t being set to 10 µs. On this sample, the Id-Vg characteristics were measured for the forward reading with respect to the writing and the reverse reading with respect to the writing. In the forward reading, the Id-Vg characteristics were measured with the diffused layer on the side where the charges were written set as the drain, and in the reverse reading, the Id-Vg characteristics were measured with the diffused layer on the side where the charges were not written set as the drain.

As seen in the graph, the shift is observed in the Id-Vg characteristics between the forward reading and the reverse reading, and it is found that the threshold voltage changed. Based on this, it can be confirmed that the charges are stored locally in the hafnium oxide dots 16 in the charge storage layer 26.

Based on the above, the semiconductor memory device according to the present embodiment including the charge storage layer 26 containing hafnium oxide dots 16 is applicable to the NAND-type memory cell and the MirrorBit-type memory cell.

It is considered that hafnium oxide, which is insulator, is formed in hafnium oxide film to be used as a charge storage layer, as in the semiconductor memory device using ONO film as the charge storage layer. However, hafnium oxide even in hafnium oxide film cannot function as a charge storage layer of good characteristics.

FIG. 4 is a graph showing the charge retaining characteristics of a semiconductor memory device including the charge storage layer 26 having a hafnium oxide film formed between the tunnel insulating film 12 and the top insulating film 24. FIG. 5 is a graph showing the charge retaining characteristics of the semiconductor memory device according to the present embodiment including the charge storage layer 26 having the hafnium oxide particles between the tunnel insulating film 12 and the top insulating film 24.

As seen in FIG. 4, it is found that in the semiconductor memory device including the hafnium oxide film, in the cells storing charges (written bit in the graph), as time is increased, the threshold voltage Vth is lowered, and the charges are lost. On the other hand, it is found that in the erased cells storing no charges (erased bit in the graph), as time is increased, the threshold voltage Vth is increased, and charges are come in. This means that in the hafnium oxide film, charges move in the in-plane direction.

As described above, hafnium oxide film, in which the threshold voltage Vth is largely changed due to the phenomenon that charges easily move in the film, is unsuitable for the device storing information.

On the other hand, in the semiconductor memory device according to the present embodiment, which includes hafnium oxide dots, as shown in FIG. 5, in either of the cells storing charge (written bit in the graph) and the erased cells storing no charges (erased bit in the graph), the threshold voltage Vth makes no substantial changes as time is increased. That is, the semiconductor memory device according to the present embodiment, which includes hafnium oxide dots, has very good charge retaining characteristics.

Hafnium oxide can be formed in particles of not more than 4 nm by the manufacturing method the inventor of the present application found, which will be described later. Furthermore, the hafnium oxide dots can be formed in a high density exceeding $1 \times 10^{12}$ cm$^{-2}$ surface density. These particle diameter and density are more miniaturized and higher than the limit particle size of about 6-10 nm and the limit surface density of $1 \times 10^{12}$ cm$^{-2}$ of the silicon nanocrystals, and hafnium oxide is very prospective to further miniaturize the device.

The hafnium oxide dots 16 are distributed in two dimensions and equidistant from the silicon substrate 10. That is, the hafnium oxide dots 16 are formed at a substantially uniform height in the charge storage layer 26. Accordingly, depending on the film thicknesses of the tunnel insulating film 12 and the top insulating film 24, the thickness-wise position of the hafnium oxide dots 16 can be controlled. The threshold shift of a transistor much depends on a stored charge amount and a distance from the electrode, and it is very effective to control the shift amount of the threshold voltage or suppress the fluctuations of the threshold voltage that the thickness-wise position of the hafnium oxide dots 16 can be controlled.

Next, the method of manufacturing the semiconductor memory device according to the present embodiment will be explained with reference to FIGS. 6 to 9.

First, the tunnel insulating film 12 of, e.g., a 3 nm-thickness silicon oxide film is formed over the silicon substrate 10 by, e.g., thermal oxidation method. The tunnel insulating film 12 is formed by making thermal oxidation in, e.g., a 800° C. dry oxygen ambient. The oxidation method and the ambient are not limited to the above, and the film thickness is in the range of 1-10 nm.

Figure 6A:
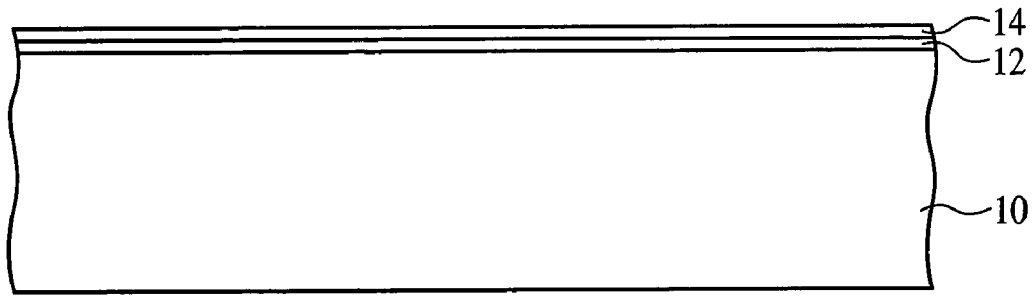
[FIG. 6]

Then, over the tunnel insulating film 12, a 1 nm-thickness hafnium oxide film 14, for example, is deposited by, e.g., MOCVD method (FIG. 6A). At this time, the film forming conditions are suitably controlled so that the hafnium oxide film 14 becomes amorphous. The hafnium oxide film 14 is deposited, e.g., at the film deposition temperature of 500° C. and under the film deposition pressure of 50 Pa. The film thickness of the hafnium oxide film 14 is about 0.5-2 nm.

The hafnium oxide film 14 can be deposited by atomic layer CVD (ALCVD: Atomic Layer Chemical Vapor Deposition) method, laser ablation (LAD: Laser Ablation Deposition) method, MBE (Molecular Beam Epitaxy) method, PVD (Physical Vapor Deposition) method or others other than MOCVD method.

In place of the hafnium oxide film 14, a film containing hafnium oxide as an ingredient may be used. For example, HfON film, HfSiO film, HfSiON film, HfAlO film or HfAlON film can be used.

Figure 6B:
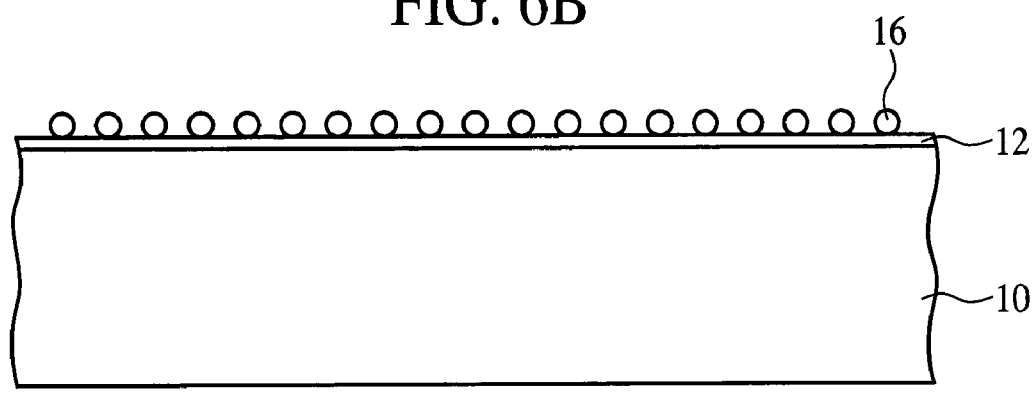

Then, thermal processing of, e.g., 1000° C. and 60 seconds is made with, e.g., a rapid thermal annealing (RTA) system. This thermal processing causes the hafnium oxide film 14 to self-cohere into spheres to be the hafnium oxide dots 16 distributed on the tunnel insulating film 12 (FIG. 6B).

At this time, the particle diameter of the formed hafnium oxide dots 16 is determined by the film thickness of the hafnium oxide film 14. That is, as shown in FIG. 8, as the film thickness of the formed hafnium oxide film 14 is larger, the average particle diameter of the hafnium oxide dots 16 is increased; specifically, when the film thickness is 0.5 nm, the average particle diameter is about 2 nm, and the average particle diameter is 3 nm when the film thickness is 1 nm.

The thermal processing temperature is a temperature necessary to cause the hafnium oxide film 14 to self-cohere. The thermal processing temperature is changed depending on the film thickness of the hafnium oxide film 14; specifically, when the film thickness is not more than 0.5 nm, not less than 1000° C. is necessary, and not less than 1050° C. is necessary when the film thickness is not less than 0.5 nm and not more than 2 nm. The temperatures below these temperatures often make the film thickness or the particle diameter disuniform or make the dots imperfect.

According to the investigations of the inventors of the present application, the hafnium oxide dots of a 2 nm-average particle diameter in the surface density of $6 \times 10^{12}$ pieces/cm$^2$ are formed by the thermal processing of 1000° C. and 60 seconds following the deposition of a 1.5 nm-thickness hafnium oxide film. The hafnium oxide dots of a 3 nm-average particle diameter in the surface density of $3 \times 10^{12}$ pieces/cm$^2$ are formed by the thermal processing of 1050° C. of 60 seconds following the deposition of a 1 nm-thickness hafnium oxide film. The surface density of $6 \times 10^{12}$ pieces/cm$^2$ can provide 120 dots per 1 cell for the 45 nm-generation and 60 dots for the 32 nm-generation, and can provide sufficiently applicable dot numbers.

Usually, the film deposited in amorphous state is polycrystallized by thermal processing. However, hafnium oxide has self-cohesive, and as the crystal growth advances, the respective grains separate from each other at the grain boundaries and discretely cohere into spheres. On the other hand, silicon nanocrystals form particles based on island-shaped nuclei formed in the initial stage of the film growth by the mechanism different from the self-cohesion of the hafnium oxide. This difference in the mechanism will be a factor for forming miniaturized particles of hafnium oxide in the high density.

Then, on the tunnel insulating film 12 with the hafnium oxide dots 16 formed on, a 10 nm-thickness HTO film, for example, is deposited by, e.g., LPCVD method to form the top insulating film 24 of the HTO film. The HTO film is deposited, e.g., at a 800° C. deposition temperature and under a 133 Pa deposition chamber pressure. The film thickness of the HTO film is about 3-20 nm. The top insulating film 24 can be a silicon oxide film deposited by MOCVD method or plasma CVD method.

Figure 9A:
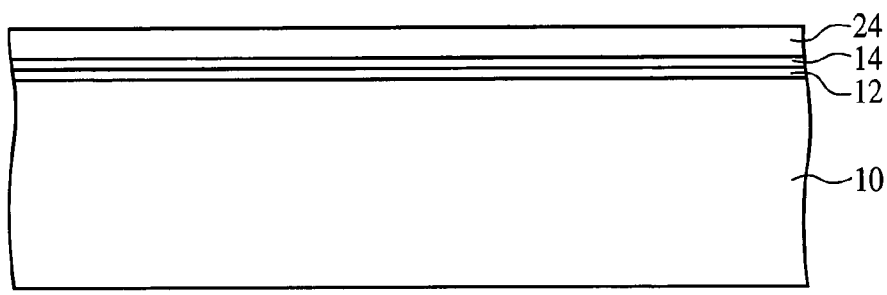
[FIG. 9]
Figure 9B:
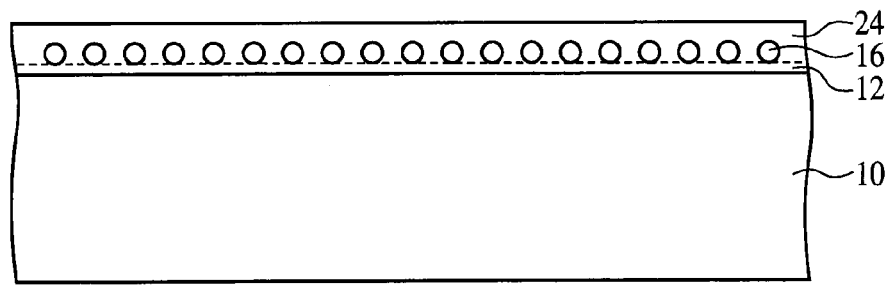

The thermal processing for causing the hafnium oxide to self-cohere may be made after the top insulating film 24 has been formed. That is, as shown in FIG. 9A, the tunnel insulating film 12, the hafnium oxide film 14 and the top insulating film 24 are sequentially formed, and then the above-described thermal processing is made to form the hafnium oxide dots 16 in the interface between the tunnel insulating film 12 and the top insulating film 24 (FIG. 9B).

The thermal processing of about 600-1000° C. may be made after the tunnel insulating film 12, the hafnium oxide film 14 and the top insulating film 24 have been respectively formed. This thermal processing makes the film dense, and good electric characteristics can be provided.

Figure 6C:
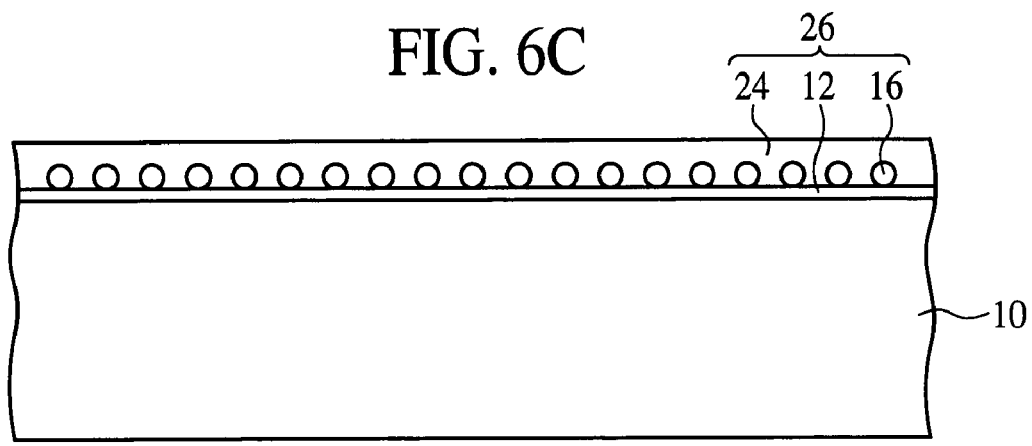

Thus, the charge storage layer 26 including the tunnel insulating film 12, the hafnium oxide dots 16 and the top insulating film 24 is formed (FIG. 6C).

Figure 7A:
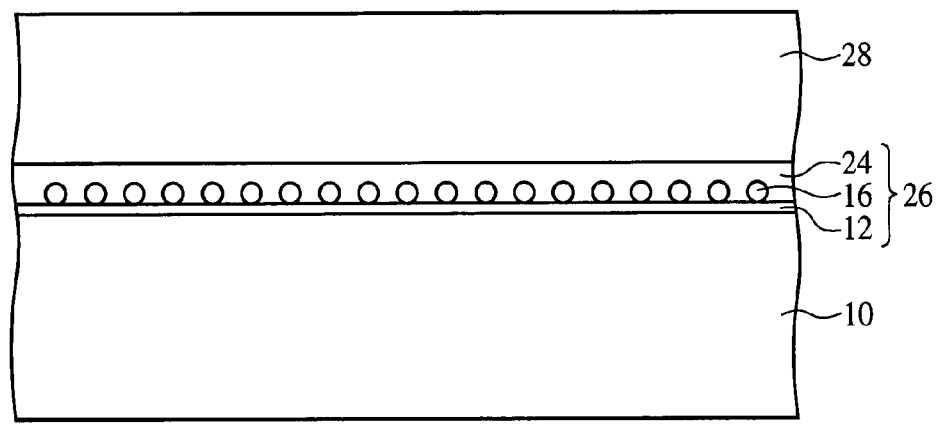
[FIG. 7]
Figure 8:
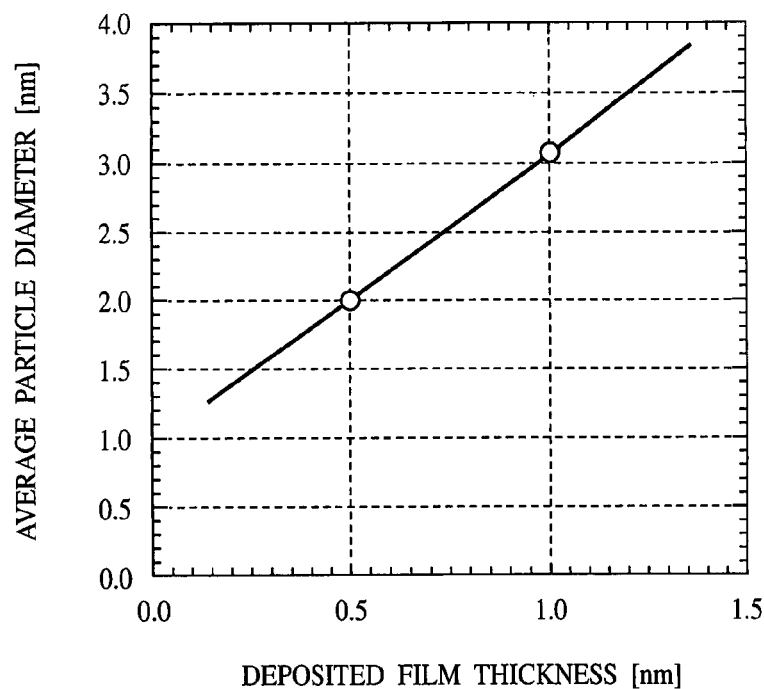
[FIG. 8]

Next, a 100 nm-thickness polycrystalline silicon film 28, for example, is deposited over the charge storage layer 26 by, e.g. LPCVD method (FIG. 7A). The polycrystalline silicon film 28 is deposited, e.g., at the deposition temperature of 600° C. under the deposition chamber pressure of 26 Pa. The film thickness of the polycrystalline silicon film 28 is about 50-200 nm. In place of polycrystalline silicon film, amorphous silicon film may be deposited, and the polycrystalline silicon film may be non-doped or doped with phosphorus or boron.

Figure 7B:
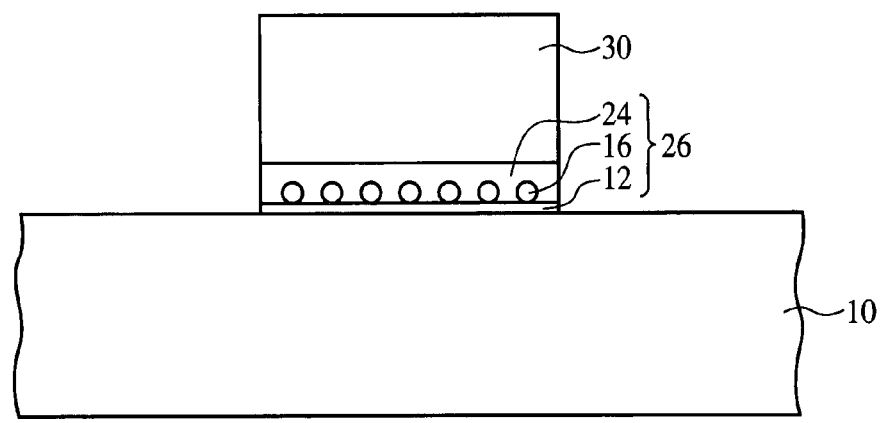

Then, the polycrystalline silicon film 28 is patterned by photolithography and dry etching to form the gate electrode 30 of the polycrystalline silicon film (FIG. 7B).

Figure 7C:
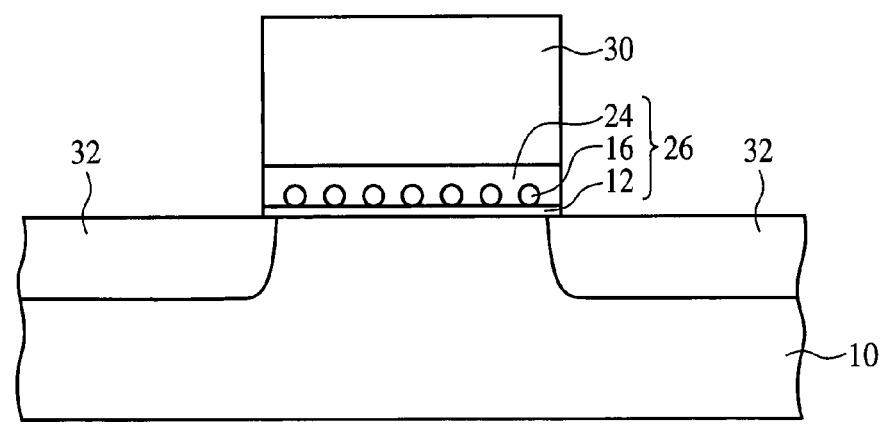

Next, with the gate electrode 30 as the mask, ions are implanted to form the source/drain regions 32 in the silicon substrate 10 on both sides of the gate electrode 30 (FIG. 7C).

As described above, according to the present embodiment, the hafnium oxide dots are formed by utilizing the self-cohesiveness of hafnium oxide, which makes it possible to form particles of not more than 4 nm-particle diameter in a high density exceeding an above $1\times10^{12}$ cm$^{-2}$ surface density. Thus, the semiconductor memory device including the charge storage layer containing the hafnium oxide dots as the charge storage bodies in a high density can be constituted, whereby the fluctuations of the charge retaining amount can be suppressed small even in more miniaturized devices.

A Second Embodiment

The semiconductor memory device and the method of manufacturing the same according to a second embodiment of the present invention will be explained with reference to FIGS. 10 to 12. The same members of the present embodiment as those of the semiconductor memory device and the method of manufacturing same according to the first embodiment shown in FIGS. 1 to 9 are represented by the same reference numbers not to repeat or to simplify their explanation.

Figure 10:
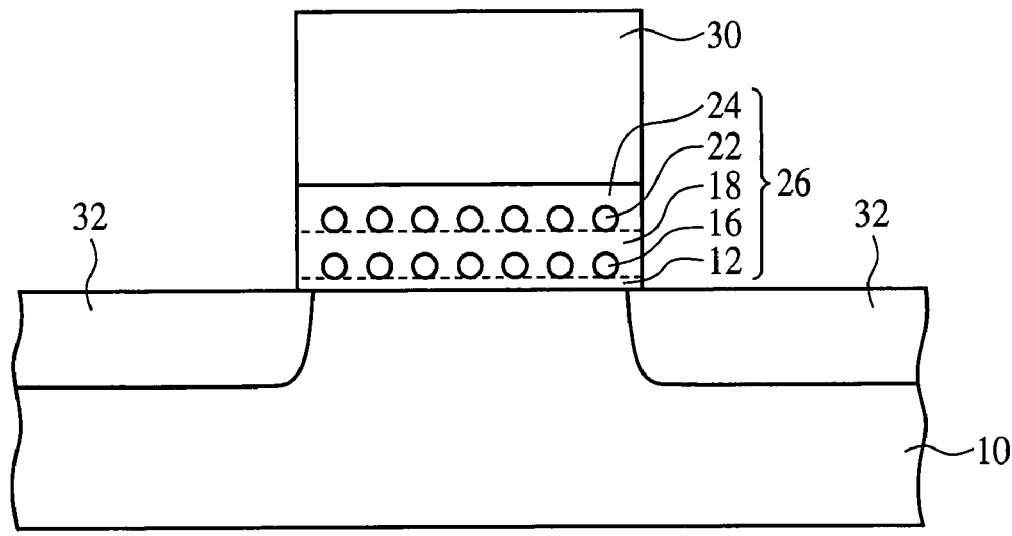
[FIG. 10]

FIG. 10 is a diagrammatic sectional view showing a structure of the semiconductor memory device according to the present embodiment. FIG. 11 is a graph showing the Id-Vg characteristics of the semiconductor memory device according to the present embodiment. FIG. 12 is sectional views showing the method of manufacturing the semiconductor memory device according to the present embodiment.

First, the structure of the semiconductor memory device according to the present embodiment will be explained with reference to FIG. 10.

The semiconductor memory device according to the present embodiment is characterized in that, as shown in FIG. 10, hafnium oxide dot layers are stacked in the charge storage layer 26. That is, the charge storage layer 26 comprises a tunnel insulating film 12, an intermediate insulating film 18 formed over the tunnel insulating film 12, a top insulating film 24 formed over the intermediate insulating film 18, a hafnium oxide dots 16 formed, distributed in the interface between the tunnel insulating film 12 and the intermediate insulating film 18, and hafnium oxide dots 22 formed, distributed in the interface between the intermediate insulating film 18 and the top insulating film 24.

The number of the hafnium oxide dot layers in the charge storage layer 26 is thus increased, whereby the charge storage amount per a unit area can be increased, and the operation margin of the semiconductor memory device can be thus increased.

Figure 11:
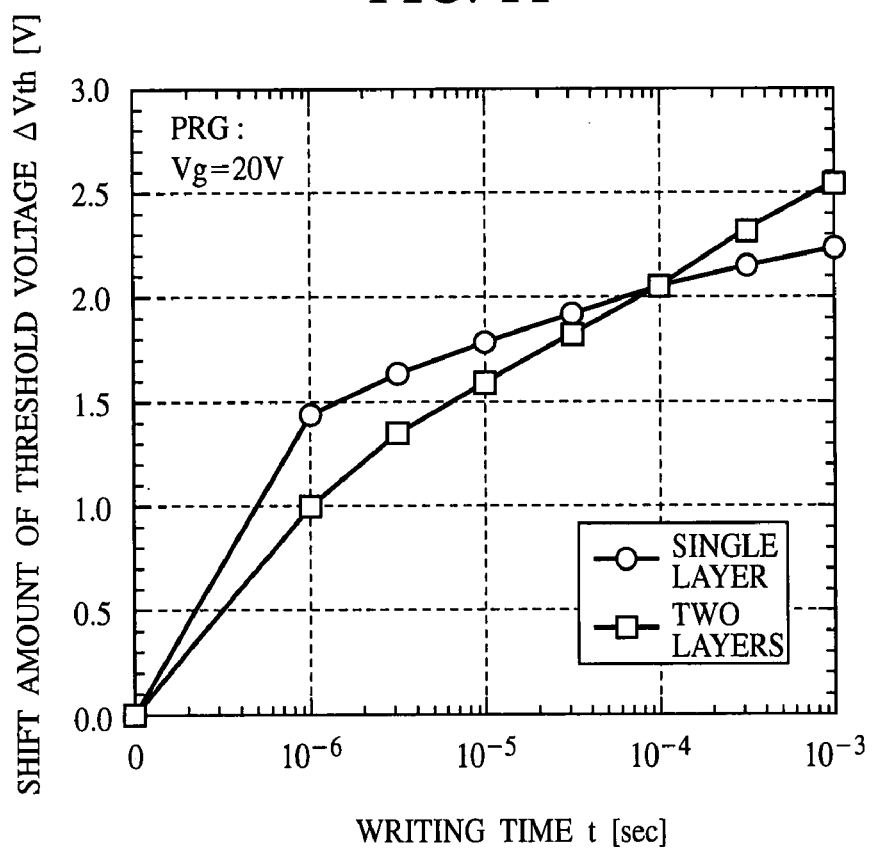
[FIG. 11]

FIG. 11 is a graph of the writing time dependency of the shift amount of the threshold voltage. In the graph, the O marks indicate the case of the semiconductor memory device according to the first embodiment, which includes a single hafnium oxide dot layer. The □ marks indicate the case that two hafnium oxide dot layers are formed. The samples used in the measurement had the hafnium oxide dots formed by depositing the hafnium oxide in a 1 nm-thickness and making the thermal processing of 1050° C. of 60 seconds. The writing in the samples were assumed to be in NAND-type cell and was made by injecting electrons from the substrate side by F-N tunneling with the gate voltage Vg being set to Vg=20 V and the substrate voltage Vb being set to Vb=0.

As shown, in the case where the hafnium oxide dots are in a single layer, the charge storage layer 26 is thin, and a larger shift amount of the threshold voltage can be obtained in a short writing time. On the other hand, in the case where the hafnium oxide dots are in two layers, the charge storage layer 26 is thicker, which makes the writing time longer than in the case of the single hafnium oxide dot layer. However, the larger capacity of trapping charges finally makes the shift amount of the threshold voltage larger than that of the case of the single hafnium oxide dot layer.

The hafnium oxide dots 16, 22 are distributed respectively in two dimensions and equidistant from the silicon substrate 10. That is, the hafnium oxide dots 16, 22 are formed respectively at a substantially uniform height in the charge storage layer 26. Accordingly, depending on the film thickness of the tunnel insulating film 12, the intermediate insulating film 18 and the top insulating film 24, the thickness-wise positions of the hafnium oxide dots 16, 22 can be controlled. The threshold shift of a transistor largely depends on the stored charge amount and the distance from the electrode, and it is accordingly very effective to control the shift amount of the threshold voltage and suppress the fluctuations of the threshold voltage that the thickness-wise positions of the hafnium oxide dots 16, 22 can be controlled.

Next, the method of manufacturing the semiconductor memory device according to the present embodiment will be explained with reference to FIG. 12.

First, in the same way as in the method of manufacturing the semiconductor memory device according to the first embodiment shown in FIG. 6A, the tunnel insulating film 12 and the hafnium oxide film 14 are formed over the silicon substrate 10.

Next, over the hafnium oxide film 14, a 3 nm (preferably 1-5 nm)-thickness HTO film, for example, is deposited by, e.g., LPCVD method to form the intermediate insulating film 18 of HTO film.

Next, over the intermediate insulating film 18, a 1 nm-thickness hafnium oxide film 20, for example, is deposited by, e.g., MOCVD method. At this time, the film forming conditions are controlled so that the hafnium oxide film 20 becomes amorphous. The hafnium oxide film 20 is deposited at the deposition temperature of 500° C. and under the deposition chamber pressure of 50 Pa. The film thickness of the hafnium oxide film 20 is about 0.5-2 nm.

Figure 12A:
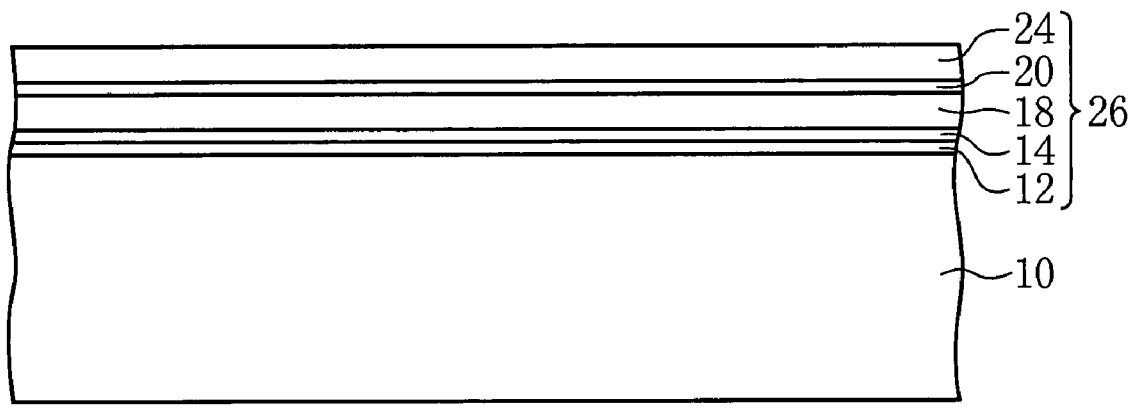
[FIG. 12]

Next, over the hafnium oxide film 20, a 10 nm-thickness HTO film, for example, is deposited by, e.g., LPCVD method to form the top insulating film 24 of HTO film (FIG. 12A). The HTO film is deposited, e.g., at the film deposition temperature of 800° C. and under the deposition chamber pressure of 133 Pa. The film thickness of the HTO is about 3-20 nm. The top insulating film 24 can be the silicon oxide film deposited by MOCVD method or plasma CVD method.

Figure 12B:
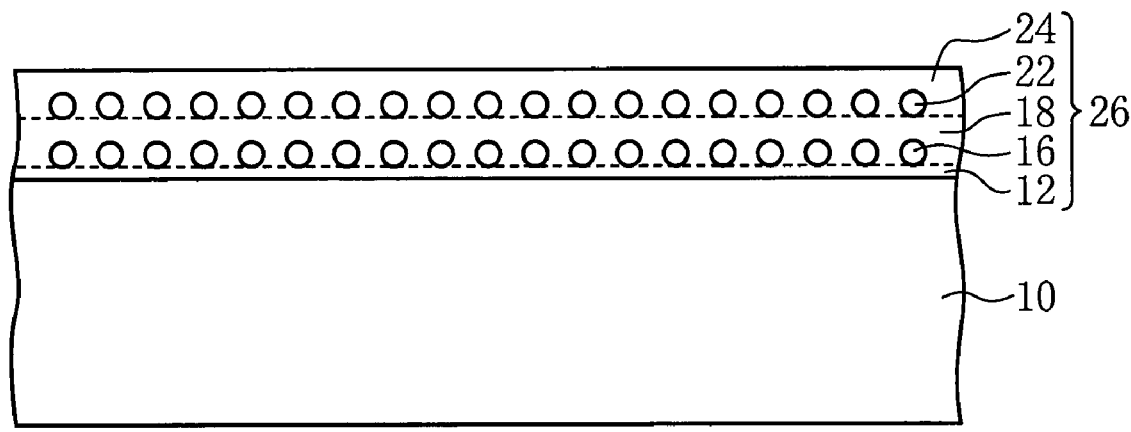

Then, thermal processing of, e.g., 1000° C. and 60 seconds is made with, e.g., a rapid thermal annealing (RTA) system. This thermal processing causes the hafnium oxide film 14 to self-cohere into spheres to be the hafnium oxide dots 16 and the hafnium oxide film 20 to be self-cohere into spheres to be the hafnium oxide dots 22 (FIG. 12B).

At this time, the hafnium oxide dots 16 substantially maintains the positional relationship between the tunnel insulating film 12 and the intermediate insulating film 18. The hafnium oxide dots 22 substantially maintain the positional relationship between the intermediate insulating film 18 and the top insulating film 24. That is, the hafnium oxide dots 16, 22 are formed in the charge storage layer 26 at respective substantially uniform heights.

Thus, the film thickness of the tunnel insulating film 12, the intermediate insulating film 18 and the top insulating film 24 are controlled, whereby the thickness-wise positions of the hafnium oxide dots 16, 22 can be controlled. The threshold shift of a transistor largely depends on the stored charge amount and the distance from the electrode, and it is very effective to control the shift amount of the threshold voltage and suppress the fluctuations of the threshold voltage that the thickness-wise positions of the hafnium oxide dots 16, 22 can be controlled.

The thermal processing for forming the hafnium oxide dots 16, 22 may be made separately. For example, it is possible that the tunnel insulating film 12 and the hafnium oxide film 14 are formed, the hafnium oxide dots 16 are formed by the thermal processing, the intermediate insulating film 18 and the hafnium oxide film 20 are formed over the tunnel insulating film 12 with the hafnium oxide dots 16 formed on, the hafnium oxide dots 22 are formed by the thermal processing, and the top insulating film 24 is formed over the intermediate insulating film 18 with the hafnium oxide dots 22 formed on.

Thermal processing of about 600-1000° C. may be made after the tunnel insulating film 12, the hafnium oxide film 14, the intermediate insulating film 18, the hafnium oxide film 20 and the top insulating film 24 have been respectively deposited. This thermal processing makes the film denser, and good electric characteristics can be provided.

Thus, the charge storage layer 26 including the tunnel insulating film 12, the hafnium oxide dots 16, the intermediate insulating film 18, the hafnium oxide dots 22 and the top insulating film 24 can be formed.

Then, in the same way as in, e.g., the method of manufacturing the semiconductor memory device according to the first embodiment shown in FIGS. 7A to 7C, the gate electrode 30, the source/drain regions 32, etc. are formed.

As described above, according to the present embodiment, the hafnium oxide dots are formed by utilizing the self-cohesiveness of hafnium oxide, whereby particles of not more than 4 nm-particle diameter can be formed in a high density exceeding the surface density of $1 \times 10^{12}$ cm$^{-2}$. Thus, the semiconductor memory device can include the charge storage layer containing the hafnium oxide dots as charge storage bodies in a high density, and the fluctuations of the charge retaining amount can be suppressed smaller also in more miniaturized devices.

Two layers of the hafnium oxide dots are formed in the charge storage layer, whereby the stored charge amount per a unit area can be increased. Thus, the operation margin of the device can be increased.

Modified Embodiments

The present invention is not limited to the above-described embodiments and can cover other various modifications.

For example, in the first and the second embodiments described above, the thermal processing for forming the hafnium oxide dots is made after the hafnium oxide film has been formed or after the top insulating film 24 has been formed. However, the thermal processing may be made any time after the hafnium oxide film has been formed and any number of times. For example, the hafnium oxide dots may be formed by the thermal processing made after the gate electrode 30 has been formed.

In the first embodiment, the semiconductor memory device including a single layer of hafnium oxide dots is described, and in the second embodiment, the semiconductor memory device including 2 layers of hafnium oxide dots is described. However, the number of the hafnium oxide dot layers is not limited to the above. The semiconductor memory device may include 3 or more layers of the hafnium oxide dots. A larger number of the layers can increase the charge storage amount per a unit area.

In the above-described embodiments, the present invention is applied to the semiconductor memory device including the charge storage layer containing the hafnium oxide dots. However, metal oxides or metal nitrides other than hafnium oxide, e.g., hafnium nitride (HfN), zirconium oxide ($ZrO_x$), zirconium nitride (ZrN), tantalum oxide ($TaO_x$), tantalum nitride (TaN), titanium oxide ($TiO_x$), titanium nitride (TiN), etc. having self-cohesiveness can self-cohere into dots. Accordingly, these substances can be used to form dots having the same charge storing function as hafnium oxide dots can be formed miniaturized in high densities. Oxynitride film, silicate film, aluminate film, etc. may be used as long as the films contain these substances as the ingredients.

INDUSTRIAL APPLICABILITY

The semiconductor memory device and the method of manufacturing the same according to the present invention make it possible to form particles usable as charge storage bodies, much miniaturized in a high surface density, and is useful to miniaturize and highly integrate semiconductor memory devices which store charges in nanodots, nanoparticles, etc. to thereby memorize information.

The invention claimed is:

1. A semiconductor memory device comprising:
   a charge storage layer formed over a semiconductor substrate, the charge storage layer comprising:
      a first insulating film;

first particles as charge storage bodies, formed over the first insulating film;
a second insulating film formed over the first insulating film and the first particles;
second particles as charge storage bodies formed over the second insulating film; and
a third insulating film formed over the second insulating film and the second particles; and
a gate electrode formed over the charge storage layer,
wherein the first particles and the second particles include metal oxide or metal nitride.

2. The semiconductor memory device according to claim 1, wherein
the first particles are distributed over the first insulating film in two dimensions and equidistant from the semiconductor substrate, and
the second particles are distributed over the second insulating film in two dimensions and equidistant from the semiconductor substrate.

3. The semiconductor memory device according to claim 1, wherein
the first and the second particles have an average particle diameter of not more than 4 nm.

4. The semiconductor memory device according to claim 1, wherein
the first and the second particles are formed in a surface density of not less than $1 \times 10^{12}$ pieces/cm$^2$.

5. The semiconductor memory device according to claim 1, wherein
the first and the second particles are insulative.

6. The semiconductor memory device according to claim 1, wherein
the metal oxide or the metal nitride is a substance having a self-cohesiveness.

7. The semiconductor memory device according to claim 1, wherein
the first and/or the second particles contain hafnium oxide as an ingredient.

8. The semiconductor memory device according to claim 1, wherein
the metal oxide or the metal nitride is a material selected from the group consisting of: hafnium oxide, hafnium nitride, zirconium oxide, zirconium nitride, tantalum oxide, tantalum nitride, titanium oxide and titanium nitride.

* * * * *